United States Patent [19]
Inoue

[11] Patent Number: 5,768,199
[45] Date of Patent: Jun. 16, 1998

[54] SEMICONDUCTOR MEMORY DEVICE WITH DUAL PRECHARGE OPERATIONS

[75] Inventor: Kouji Inoue, Ikoma, Japan

[73] Assignee: Sharp Kabushiki Kaisha, Osaka, Japan

[21] Appl. No.: 709,013

[22] Filed: Sep. 6, 1996

[30]      Foreign Application Priority Data

Sep. 8, 1995  [JP]  Japan ................................ 7-231775

[51] Int. Cl.$^6$ ........................................... G11C 7/00
[52] U.S. Cl. ................................... 365/203; 365/204
[58] Field of Search .................................. 365/203, 204

[56]            References Cited

U.S. PATENT DOCUMENTS 5,627,788  5/1997  Chang et al. ........................ 365/204

FOREIGN PATENT DOCUMENTS 61-217992  9/1986  Japan .
2-12694    1/1990  Japan .

*Primary Examiner*—Joseph E. Clawson, Jr.
*Attorney, Agent, or Firm*—Morrison & Foerster LLP

[57]              ABSTRACT

A semiconductor memory device includes a memory cell array for storing data. The memory cell array includes a plurality of columns of memory cells and a plurality of bit lines connected to the memory cell array for reading out the data. The semiconductor memory device further includes a first precharge operation control circuit for performing a precharge operation with respect to all of the plurality of bit lines immediately after power is turned on.

7 Claims, 8 Drawing Sheets

SEMICONDUCTOR MEMORY DEVICE WITH DUAL PRECHARGE OPERATIONS

BACKGROUND OF THE INVENTION

1. Field of the Invention

The present invention relates to a semiconductor memory device for reading out data via bit lines such as a mask ROM and a static RAM.

2. Description of the Related Art

A conventional semiconductor memory device such as a mask ROM or static RAM performs precharging and equalizing operations with respect to a bit line corresponding to an input address while activating a word line corresponding to the input address. In this system, as power supply voltage is lowered, a period of time required for precharging the bit line becomes longer than a period of time required for activating the word line. As a result, the precharge operation is a large factor of access time delay.

Furthermore, in recent years, the following memory has been developed for the, purpose of shortening the period of time required for the precharge operation. The memory device is supplied with a charge of a precharge level from the opposite side of where a precharge circuit is disposed (i.e., the side opposite to the side from which the bit lines are supplied with a charge by a precharge circuit) while performing ordinary operations of precharging the bit lines by the precharge circuit. One example of such a memory is disclosed in Japanese Laid-Open Patent Publication No. 2-12694.

In this type of device such as a mask ROM, when adjacent ROM cells are successively accessed, for example, in the case of incrementing an address, and ROM cells in the vicinity of the accessed one are constituted by "ON-transistors" which can turn on in response to a selection signal on a word line, the charge of the bit line to be accessed is affected by a virtual ground line accessed in the previous cycle. Thus, access delay may result. In this case, access to a memory cell is very slow.

SUMMARY OF THE INVENTION

A semiconductor memory device of the invention includes a memory cell array for storing data. The memory cell array includes a plurality of columns of memory cells and a plurality of bit lines connected to the memory cell array for reading out the data. The semiconductor memory device further includes a first precharge operation control circuit for performing a precharge operation with respect to all of the plurality of bit lines immediately after power is turned on.

According to the present invention, when power is turned on, a scanning of a precharge circuit for precharging all bit lines is conducted by a first precharge operation control circuit. As a result, the precharge for the bit lines is completed and thus the bit lines are in a precharge level prior to the first access when power is turned on. Thus, upon completing the activation of a word line corresponding to an input address, a sense operation for the bit line can be immediately performed. Therefore, a period of time required for a readout operation (i.e., access time) can be significantly shortened.

A second precharge operation control circuit is disposed on the opposite side across a memory cell array storing data. While a column corresponding to an address is selected and accessed, the second precharge operation control circuit precharges the bit lines corresponding to all the other columns. With such a structure, a charge of the precharge level can be constantly maintained on the bit lines. Thus, upon completing the activation of the word line corresponding to the input address, the sense operation for the bit lines can be immediately performed. Thus, the access time can be significantly shortened.

At a standby state, all the bit lines can be precharged by the second precharge operation control circuit so that a charge of the precharge level is maintained in all the bit lines. As a result, at the first access after the memory cell array is out of the standby state, upon completing the activation of a word line corresponding to an input address, the sense operation for the bit line can be immediately performed. Thus, the access time can be significantly shortened.

According to the present invention, a charge of the precharge level is supplied to virtual ground lines other than the virtual ground line to be accessed. In addition, the charge of the precharge level is not supplied to the virtual ground line to be accessed. Thus, the access delay is prevented, so that the access time can be significantly shortened.

Thus, the invention described herein makes possible the advantages of (1) providing a semiconductor memory device capable of shortening a period of time for a precharge operation to shorten a period of time for a readout operation by precharging bit lines when the power supply is turned on, a standby state is maintained, and an ordinary readout operation is being performed.

These and other advantages of the present invention will become apparent to those skilled in the art upon reading and understanding, the following detailed description with reference to the accompanying figures.

DESCRIPTION OF THE PREFERRED EMBODIMENTS

The present invention will be described by way of examples with reference to the accompanying drawings.

3

Figure 1:
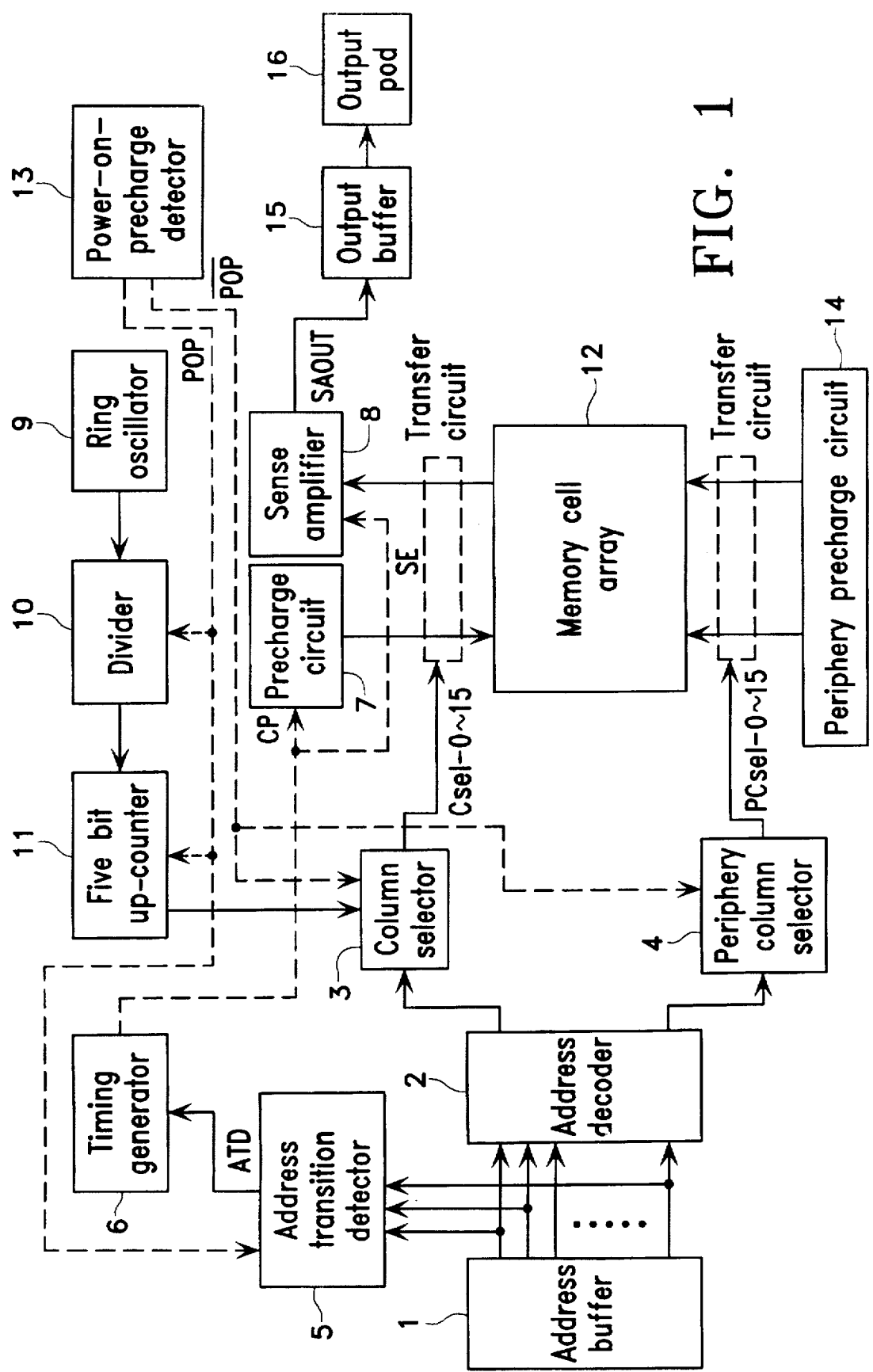
FIG. 1 is a block diagram illustrating a structure of a semiconductor memory device In one embodiment of the present invention.

FIG. 1 is a block diagram illustrating a structure of a semiconductor memory device in one embodiment of the present invention.

As shown in FIG. 1, an address buffer 1 is connected to a column selector 3 and a periphery column selector 4 via an address decoder 2. An address transition detector 5 connected to the address buffer 1 is connected to a timing generator 6. The timing generator 6 is connected to a precharge circuit 7 and a sense amplifier 8.

A ring oscillator 9 outputs oscillating signals immediately after power is turned on. A divider 10 connected to the ring oscillator 9 divides the oscillating signals output from the ring oscillator 9. A five bit up-counter 11 connected to the divider 10 generates precharge address signals in response to a clock output from the divider 10. A column selector 3 connected to the five bit up-counter 11 decodes the precharge address signals to generate precharge column address signals for selecting a column in accordance with an input address. The precharge circuit 7 is connected to a memory cell array 12, and precharges bit lines based on the precharge column address signals generated in the column selector 3. A power-on-precharge (hereinafter, referred to as POP) detector 13 is connected to the divider 10 and the five bit up-counter 11, and outputs power-on-precharge signals (hereinafter, referred to as POP signals) to the divider 10 and the five bit up-counter 11. The POP detector 13 is connected to the column selector 3, and outputs power-on-precharge bar signals (hereinafter, referred to as POP bar signals). The above-mentioned components, i.e., the ring oscillator 9, the divider 10, the five bit up-counter 11, the column selector 3, the precharge circuit 7 and the POP detector 13, constitute a first precharge operation control circuit. By the first precharge operation control circuit, the bit lines are scanned and precharged immediately after power is turned on.

Furthermore, a periphery precharge circuit 14 is connected to the memory cell array 12, and precharges bit lines from the side opposite to where the precharge circuit 7 is disposed based on the precharge column address signals generated in the periphery column selector 4. The POP detector 13 is connected to the periphery column selector 4, and outputs the POP bar signals to the periphery column selector 4. The above-mentioned components i.e., the periphery precharge circuit 14 and the periphery column selector 4, constitute a second precharge operation control circuit. The second precharge operation control circuit controls as follows: while a column corresponding to a certain address is selected and accessed, bit lines corresponding to all the other columns are precharged; when the memory cell array 12 is at the standby state, all the bit lines are precharged; and a charge of the precharge level is supplied to virtual ground lines other than the virtual ground line to be accessed.

The sense amplifier 8 is connected to the memory cell array 12. An output buffer 15 is connected to an output pad 16 which is connected to an output terminal of the sense amplifier 8. An arbitrary portion of data stored in the memory cell array 12 is read out via the bit lines connected to the memory cell array 12, the sense amplifier 8, the output buffer 15 and the output pad 16. In this manner, a mask ROM as a semiconductor memory device of the present example is constituted.

Hereinafter, the column selector 3, the POP detector 13, the periphery column selector 4 and the periphery precharge circuit 14 will be described in detail.

Figure 2:
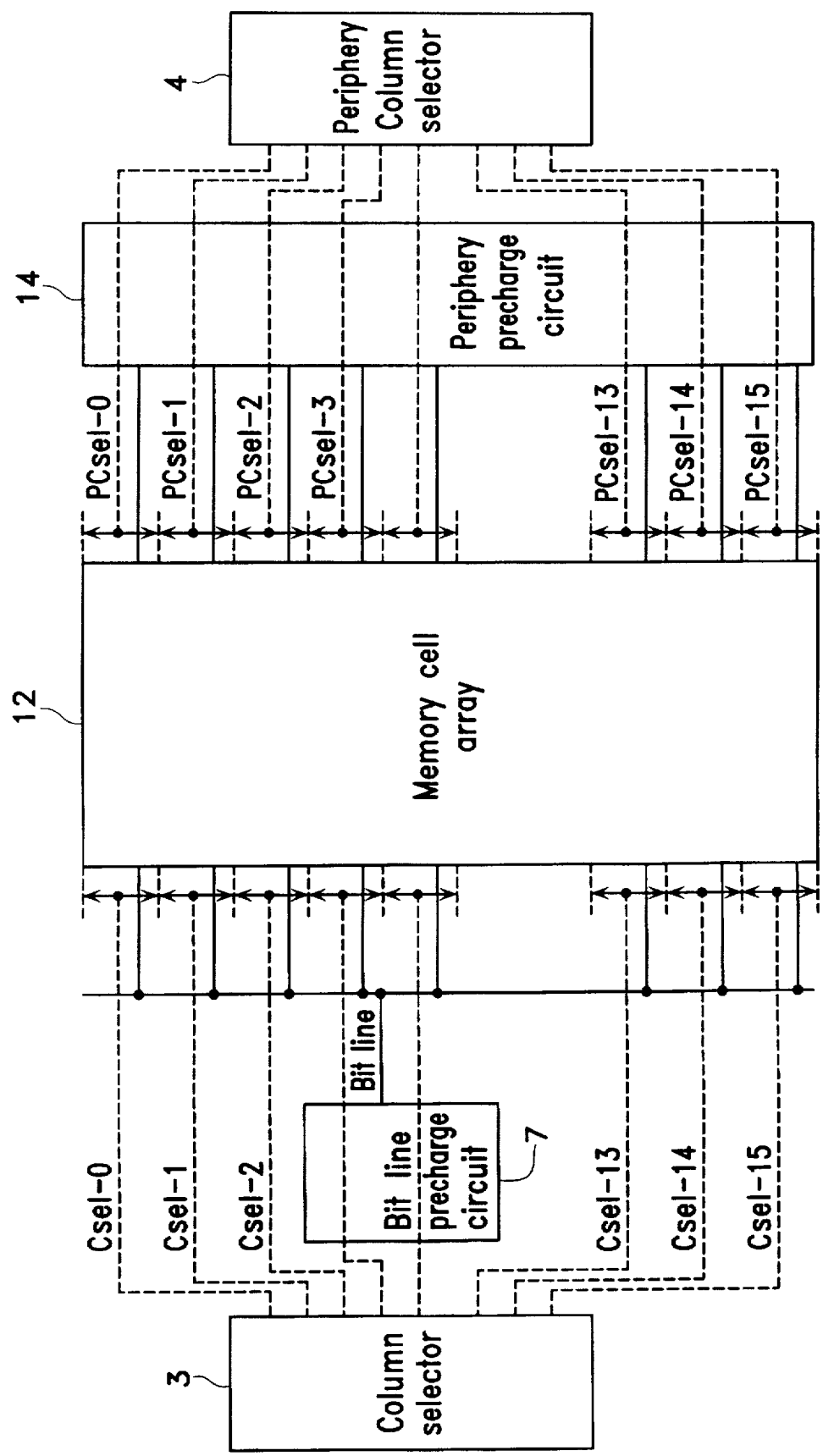
FIG. 2 is a block diagram illustrating the relationship between column selecting signals output from a column selector shown in FIG. 1 and periphery column selecting signals output from a periphery column selector shown in FIG. 1.
Figure 3:
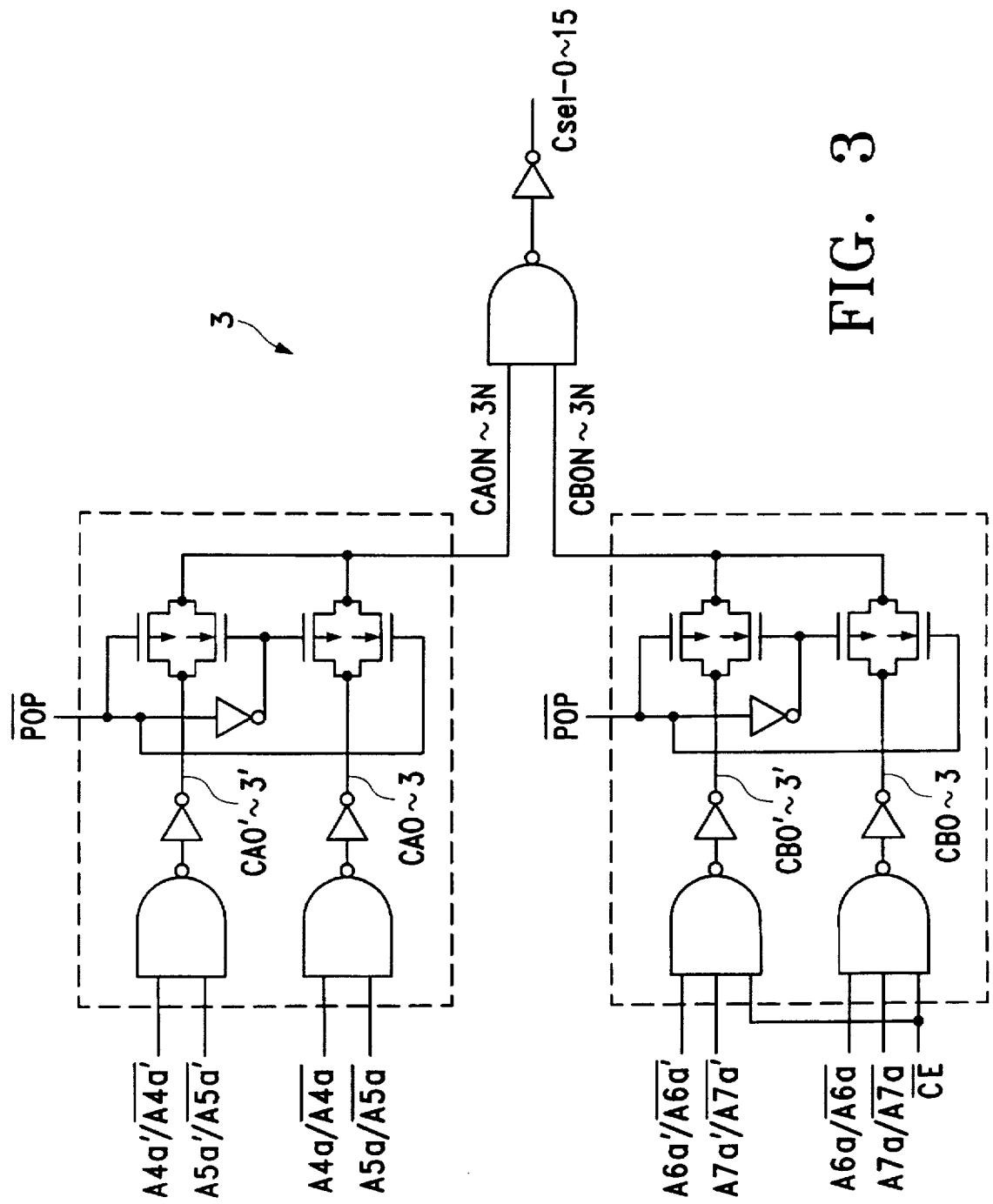
FIG. 3 is a circuit diagram of the column selector shown in FIG. 1.

FIG. 2 is a block diagram illustrating the relationship between column selecting signals $C_{sel}$-0 to $C_{sel}$-15 output from the column selector 3 shown in FIG. 1 and periphery column selecting signals $PC_{sel}$-0 to $PC_{sel}$-15 output from the periphery column selector 4 shown in FIG. 1. FIG. 3 is a circuit diagram of the column selector 3 of FIG. 1.

The column selector 3 decodes column selecting addresses A4a' to A7a' constituting precharge address signals generated by the five bit up-counter 11 when power is turned on, so as to generate signals CA0' to CA3' and CB0' to CB3'. The column selector 3 decodes addresses A4a to A7a for precharge at the time of a normal access to generate signals CA0 to CA3 and CD0 to CB3. Next, the column selector 3 identifies whether the precharge to be performed is for the occasion of supplying power, based on the POP bar signal, and selects an address to generate column selecting signals $C_{sel}$-0 to $C_{sel}$-15. Namely, for the precharge to be performed when power is turned on, the signals CA0' to CA3' and CB0' to CB3' are selected to generate the column selecting signals $C_{sel}$-0 to $C_{sel}$-15, which are column address signals for precharge. For precharge at the time of the normal access, signals CA0 to CA3 and CB0 to CB3 are selected to generate the column selecting signals $C_{sel}$-0 to $C_{sel}$-15.

Figure 4:
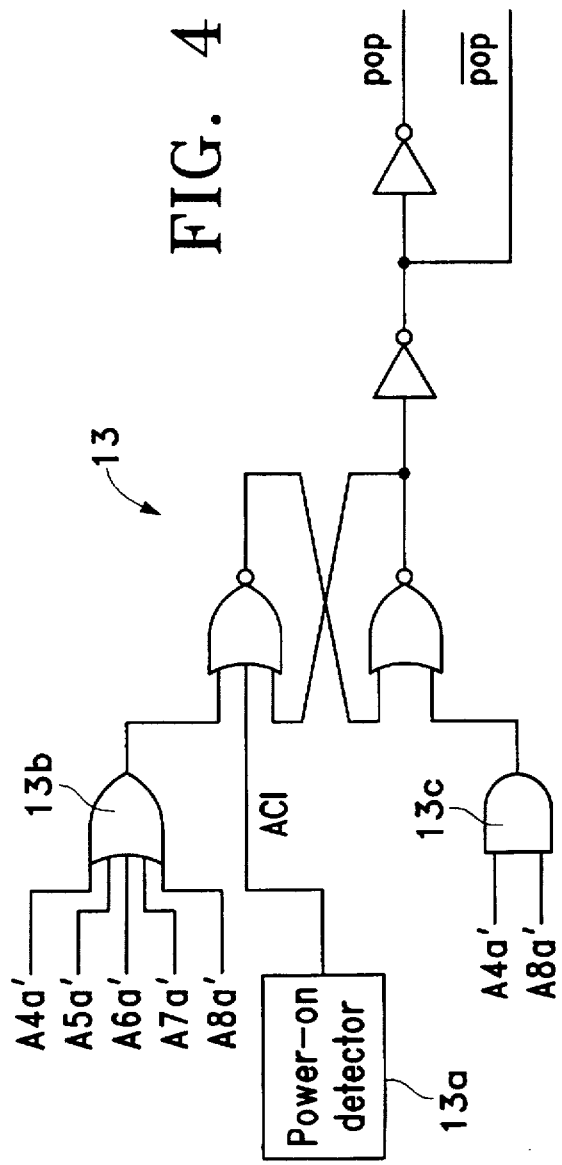
FIG. 4 is a circuit diagram of the power-on-precharge detector shown in FIG. 1.

FIG. 4 is a circuit diagram of the POP detector 13 shown in FIG. 1.

The POP detector 13 detects in a power-on detector 13a that power is turned on, and outputs a detection signal (hereinafter, referred to as an ACL signal). The ACL signal lets the POP signal go high. When the POP signal goes high, reset signals of the divider 10 and the five bit up-counter 11 are cancelled to operate the divider 10 and the five bit up-counter 11. Then, the five bit up-counter 11 generates the column selecting addresses A4a' to A8a' for precharge at the time of supplying power to input to an OR gate 13b of the POP detector 13, whereby the POP signal remains high. When all the columns are selected and all the bit lines are precharged, the addresses A4a' and A8a' go high. Then, the POP signal is reset based on AND signals of both the addresses A4a' and A8a' via an AND gate 13c.

As described above, the POP detector 13 includes a detection controller for detecting a period from the start of power supply to the completion of the precharge for all the bit lines to control so as to terminate the precharge operation for the all the bit lines by the precharge circuit 7.

Figure 5:
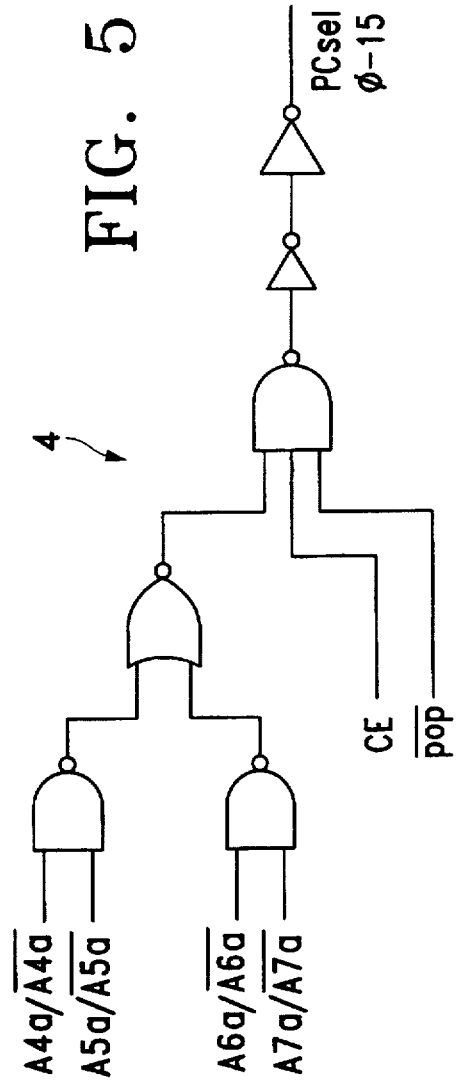
FIG. 5 is a circuit diagram of the periphery column selector shown in FIG. 1.

FIG. 5 is a circuit diagram of the periphery column selector 4 shown in FIG. 1. The periphery column selector 4 includes 16 versions of the circuit shown in FIG. 5.

The periphery column selector 4 receives a low level of the POP signal for precharge at the time when power is turned on, so as to let all periphery column selecting signals $PC_{sel}$-0 to $PC_{sel}$-15 go high. Thus, the periphery precharge circuit 14 precharges all the bit lines.

Furthermore, the periphery column selector 4 receives addresses A4a to A7a for precharge at the time of the normal access to control the periphery column selecting signals $PC_{sel}$-0 to $PC_{sel}$-15 for precharge at the time of the normal access. For example, when the column selecting signal $C_{sel}$-j (j=0, 1, 2, 3, ...) output from the column selector 3 is in the high level, the periphery column selecting signal $PC_{sel}$-j is set at the low level so as to inhibit the periphery precharge circuit 14 from precharging the corresponding bit line. However, all the other periphery column selecting signals $PC_{sel}$ are set at the high level so as to enable the corresponding bit lines to be precharged from the periphery.

Figure 6:
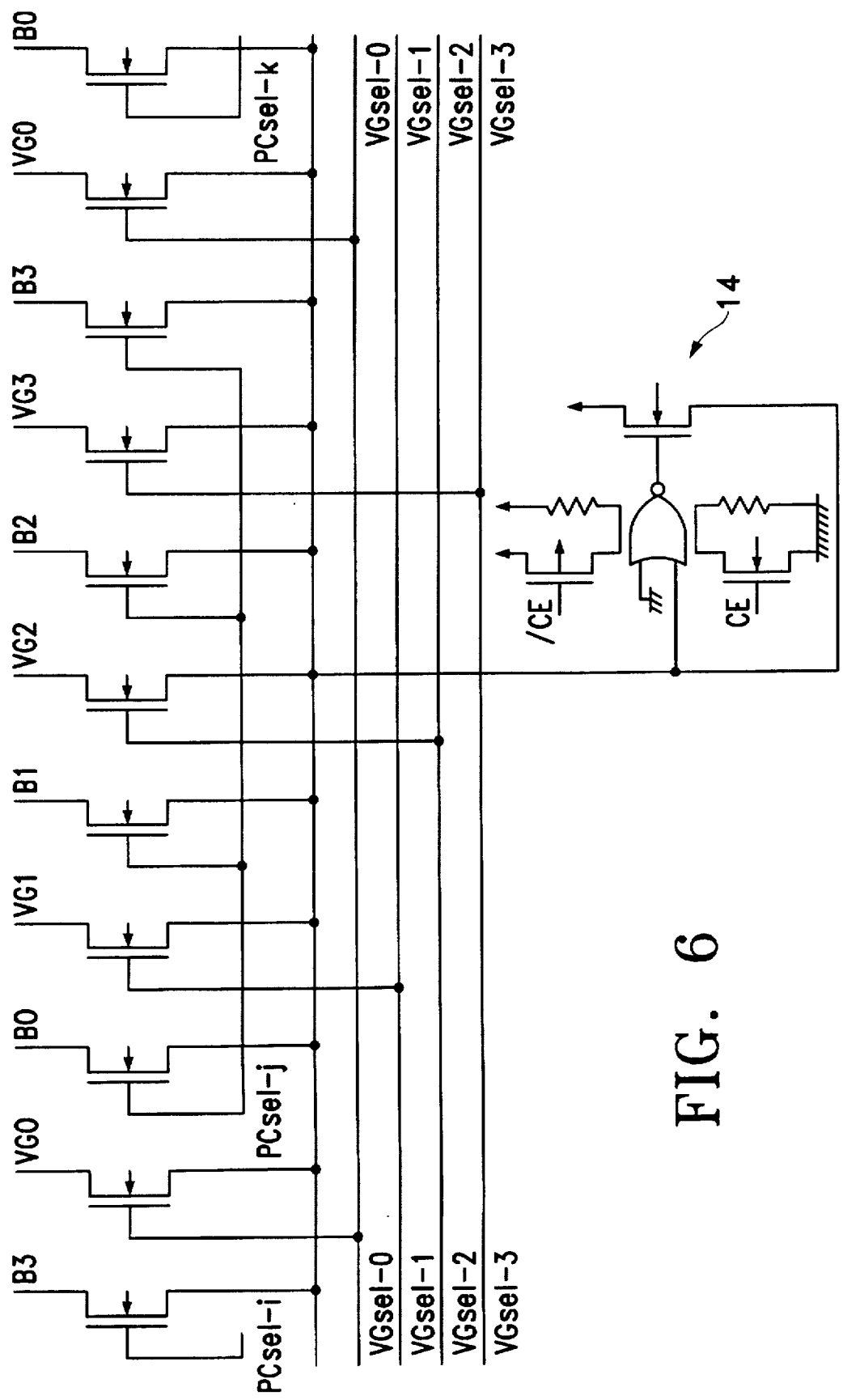
FIG. 6 is a circuit diagram of the periphery precharge circuit shown in FIG. 1.

FIG. 6 is a circuit diagram of the periphery precharge circuit 14.

The periphery precharge circuit 14 performs precharge or precharge inhibition for the bit lines from the periphery based on the periphery column selecting signals $PC_{sel}$-0 to $PC_{sel}$-15 output from the periphery column selector 4.

Figure 7:
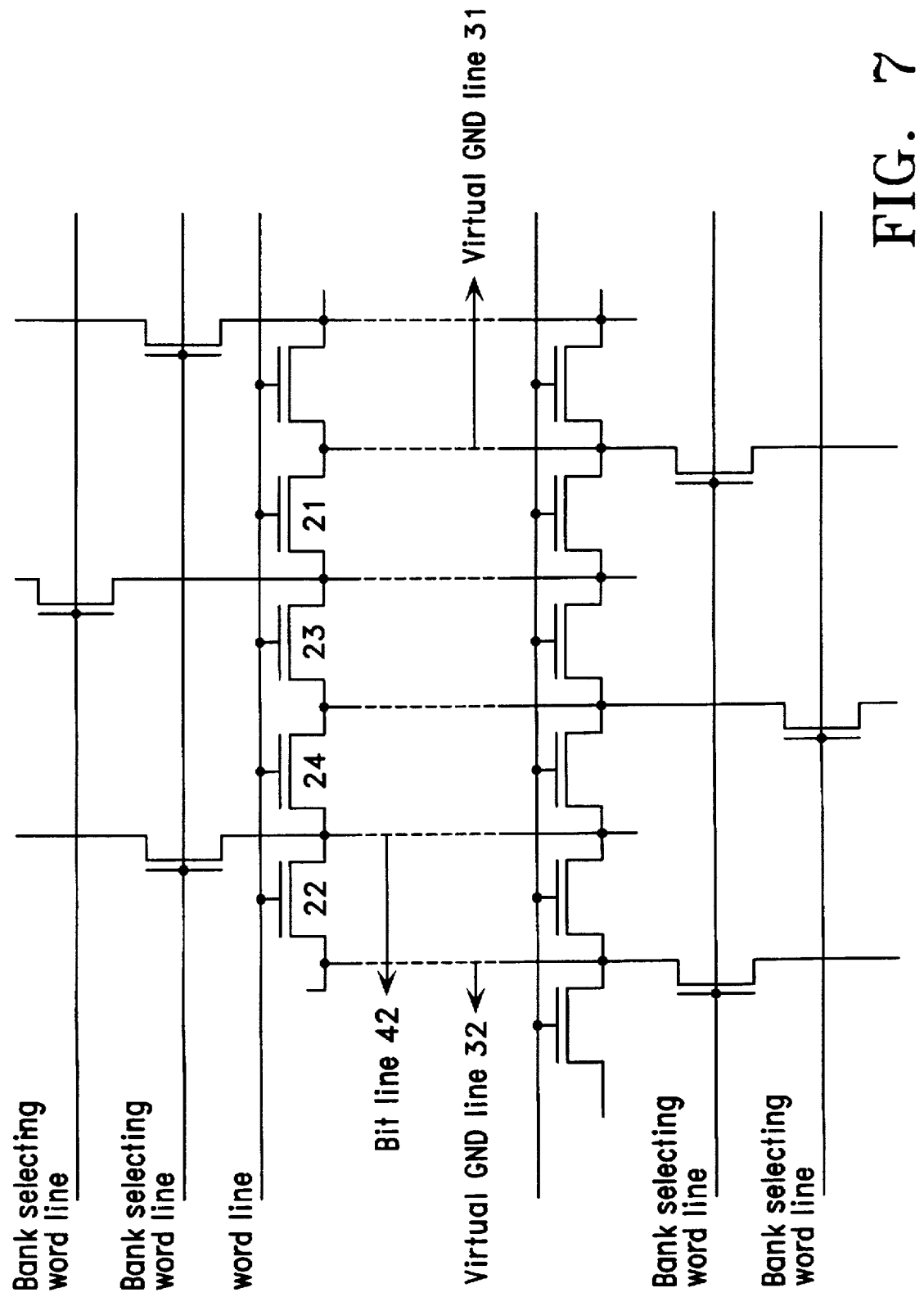
FIG. 7 is a memory block diagram illustrating a part of a memory cell array shown in FIG. 1.

Referring to FIG. 7, in the case of incrementing an address, a memory cell transistor 21 is first accessed, and then a memory cell transistor 22 is to be accessed. In this case, in accordance with the memory cell to be accessed, a virtual ground line 31 is first accessed, and then a virtual ground line 32 is to be accessed.

In FIG. 7, in the case where it takes a long time for the virtual ground line 31 which has been in the ground level in the previous cycle to be activated (i.e., to return to the precharge level), and ROM transistors 21, 23 and 24 are on-transistors, the charge of the bit line 42 to be accessed is affected by the virtual ground line 31 in connection with the RON transistors 21, 23 and 24 so as to be close to that of the virtual ground line 31. In the case where the transistor 22 to be accessed is an off-transistor, the level of the charge of the bit line 42 to be accessed is lowered, thus adversely affecting the access time.

Therefore, a charge of the precharge level is supplied to the virtual ground line 31 from the side opposite to where a precharge circuit is disposed, and a charge of the precharge level is not supplied to the virtual ground line 32 to be accessed, thus shortening the access time. As described above, the virtual ground line selecting circuit is provided so as to supply a charge of the precharge level to the virtual ground lines other than the virtual ground line to be accessed in the memory cell array 12, and not to supply a charge of the precharge level to the virtual ground line to be accessed. The precharge level is an intermediate potential, and preferably, (½) Vcc.

Figure 8:
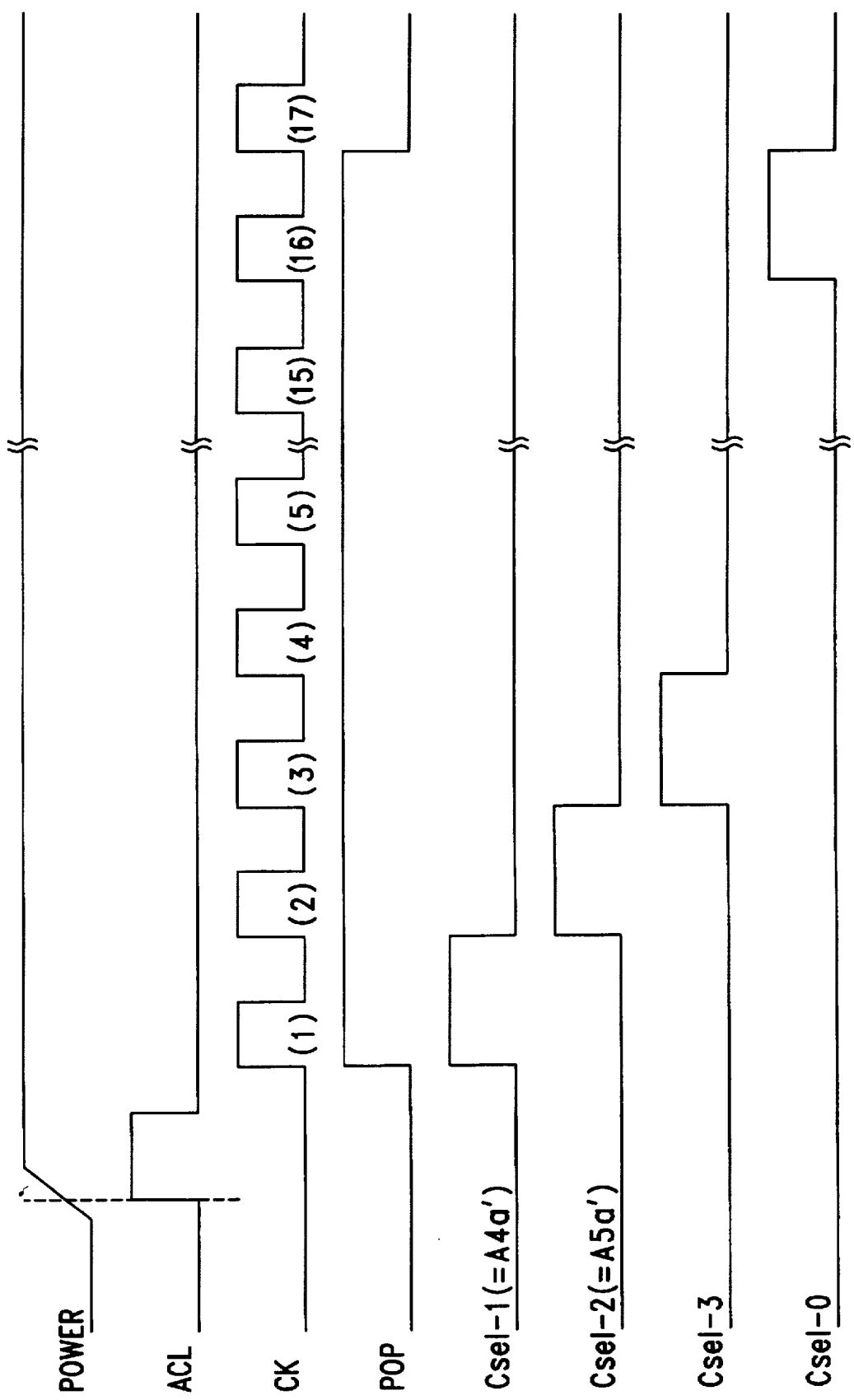
FIG. 8 is a timing chart illustrating generation procedure of column addresses for precharge at the time when power is turned on in the semiconductor memory device shown in FIG. 1.

FIG. 8 is a timing chart showing a generation procedure of column address signals for precharge at the time when power is turned on in the semiconductor memory device shown in FIG. 1.

As shown in FIG. 8, when power is turned on, the ring oscillator 9 starts to oscillate to output a mother clock to the divider 10. At the same time, the power-on detector 13a of the POP detector 13 detects that power is turned on, and outputs a power-on detection signal ACL, whereby the POP signal goes high.

When the divider 10 receives the mother clock from the ring oscillator 9, the divider 10 divides the mother clock and generates a basic clock CK to output to the five bit up-counter 11. When the five bit up-counter 11 receives the basic clock CK, the basic clock CK is counted to generate column selecting addresses A4a' to A7a' for precharge at the time when power is turned on. The addresses A4a' to A7a' are input to the column selector 3 to be decoded.

At this time, since the POP signal is in the high level, the decoded signals, i.e., the results of decoding based on the column selecting addresses A4a' to A7a' for precharge at the time when power is turned on, are selected to generate the column selecting signals $C_{sel}$-0 to $C_{sel}$-15. The column selecting signals $C_{sel}$-0 to $C_{sel}$-15 are sequentially output from the column selector 3 based on the basic clock's CK output from the divider 10 in the order as follows: $C_{sel}$-1, $C_{sel}$-2, $C_{sel}$-3, ..., $C_{sel}$-15, $C_{sel}$-0.

On the other hand, the address transition detector 5 selects an address from the addresses A4a' to A8a' at the time when power is turned on and addresses A4a to A7a for precharge at the time of normal access based on the POP signal, and generates an address transition detection signal ATD output to the timing generator 6. The timing generator 6 lets the precharge signal CP go into the high level based on the ATD signal. However, when the POP signal is in the high level, the bit line equalizing signal EQ and the sense amplifying enable signal SE remain in the low level. Thus, when power is turned on, the POP signal goes high so that bit lines selected by the column selector 3 are precharged by the precharge circuit 7.

The column selector 3 increments the column selecting signals $C_{sel}$-0 to $C_{sel}$-15 based on the basic clock CK output from the divider 10 so that the precharge circuit 7 precharges the bit lines selected by the column selecting signals $C_{sel}$-0 to $C_{sel}$-15. This precharge operation is repeated based on the basic clock CK output from the divider 10 to precharge all the bit lines. When all of the column selecting signals $C_{sel}$-0 to $C_{sel}$-15 are output, namely, all of the bit lines are precharged, the POP detector 13 lets the POP signal go low, thus completing the precharge operation for the bit lines at the time when power is turned on.

Next, the periphery column selector 4 and the precharge circuit 7 are disposed in the terminal of the memory cell array 12, i.e., on the side opposite to where the precharge circuit 7 is disposed. The periphery column selector 4 and the precharge circuit 7 allow a charge of the precharge level to be maintained in all the bit lines corresponding to all the columns except the column accessed by the precharge circuit 7 at the time of normal access. More specifically, for example, the column selecting signal $C_{sel}$-3 is turned high by the column selector 3. In the cycle when the column corresponding to the column selecting signal $C_{sel}$-3 is accessed, only the periphery column selecting signal $PC_{sel}$-3, i.e., an output signal from the periphery column selector 4, is turned low, and the periphery column selecting signals $PC_{sel}$-1 to $PC_{sel}$-15 except the periphery column selecting signal $PC_{sel}$-3 are turned high. Accordingly, the periphery precharge circuit 14 is separated from the bit line by the periphery column selecting signal $PC_{sel}$-3, thus preventing the corresponding bit line from being precharged from the periphery. However, the bit lines corresponding to the other columns are precharged by the periphery precharge circuit 14. Thus a charge of the precharge level is maintained in the bit lines. Thus, while a column corresponding to an address is selected and accessed, the periphery column selector 4 and the periphery precharge circuit 14 perform the precharge operation for the bit lines corresponding to all the other columns.

Furthermore, while the memory device is at the standby state, all of the periphery column selecting signals $PC_{sel}$-1 to $PC_{sel}$-15, i.e., the outputs from the periphery column selector 4, are turned high. Thus, the periphery precharge circuit 14 precharges all the bit lines to maintain a charge of the precharge level.

Figure 9:
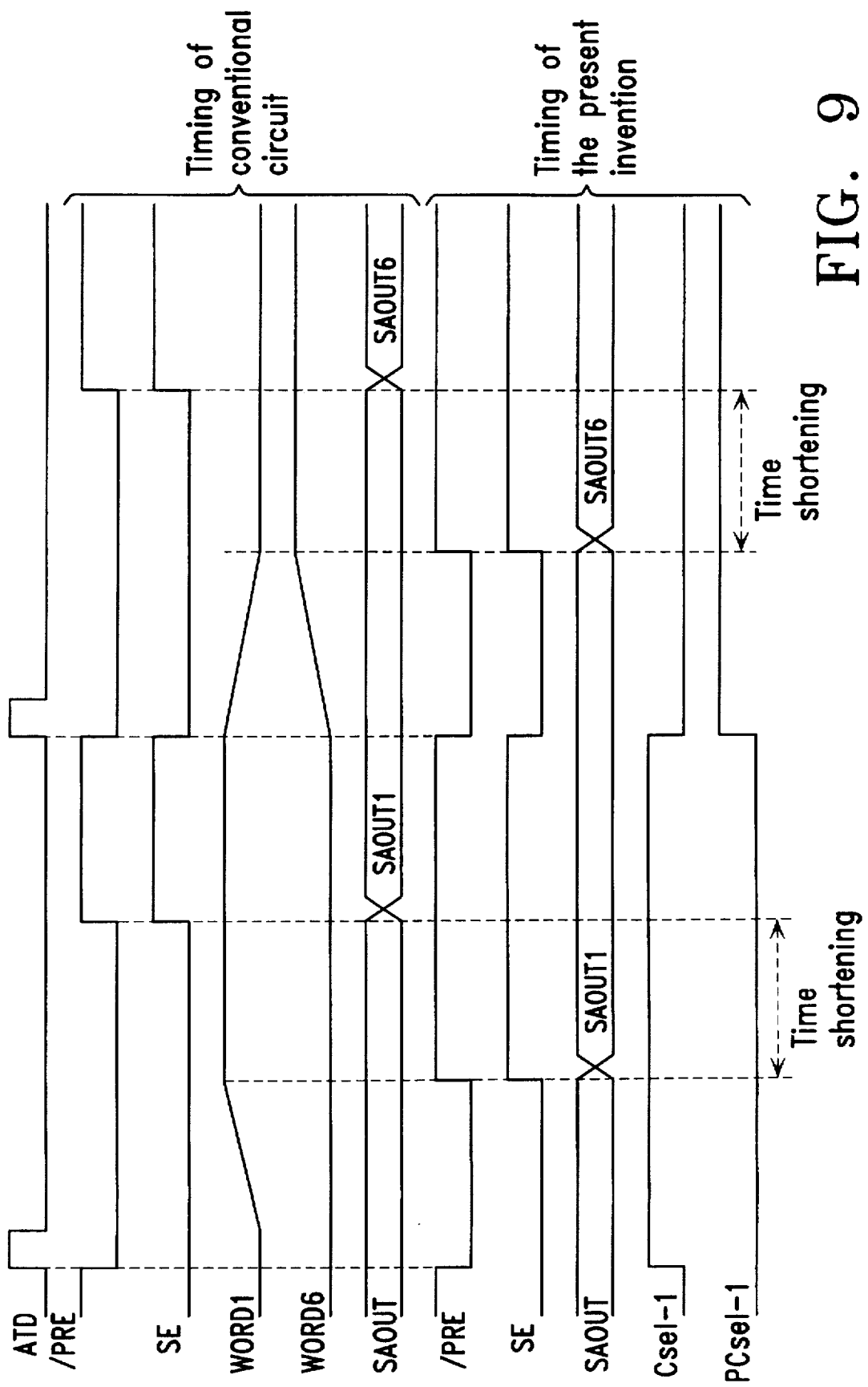
FIG. 9 is a timing chart showing shortening access time according to the present invention in comparison with a conventional example.

Furthermore, when PRE bar="low", the precharge circuit 7 is active. According to the present invention, since the bit lines are previously precharged by the periphery precharge circuit 14, a period of time during which the precharge circuit 7 remains active can be shortened. The periphery precharge circuit 14 is used as an auxiliary of the precharge circuit 7. FIG. 9 is a timing chart showing the time reduction. In FIG. 9, the timing of a conventional circuit is compared with the timing of the present invention.

For example, although a period of time required for precharging bit lines of a 4 MB mask ROM is about 30 ns (Vcc=4.5 V, Ta=80 C), a period of time required for activating a word line is about 15 ns. Accordingly, according to the present invention, the access time can be reducted by about 15 ns.

As described above, in the present example, immediately after power is turned on, a scanning of the bit line precharge circuit 7 is conducted via the column selector 3. Thus, a circuit consisting of the ring oscillator 9, the divider 10, the five bit up-counter 11 and the POP detector 13 work to precharge all the bit lines. While the column corresponding to an address is selected by the column selector 3 and accessed, the bit lines corresponding to all the columns other than the column corresponding to the address are precharged. Furthermore, when the memory device is at the standby state, all the bit lines are precharged by a circuit consisting of the periphery column selector 4 and the periphery precharge circuit 14. In the case where a memory cell in the vicinity is accessed due to address increment or the like, the access time is delayed. However, a switching circuit for virtual ground lines is provided on the side opposite to where the precharge circuit is disposed (i.e., on the side opposite to the side from which a charge of the precharge level is supplied by the precharge circuit 7) to realize the reduction of the precharge time for the bit line corresponding to an arbitrary address, thus reducing the access time.

As described above, according to the present invention, when power is turned on, a scanning of a precharge circuit is conducted to precharge all the bit lines. As a result, the precharge for the bit lines is swiftly completed at the first access when power is turned on. Thus, since the bit lines are in a precharge level, upon completing the activation of a word line corresponding to an input address, the sense operation for the bit line can be immediately performed. As a result, a period of time required for reading out can be significantly improved (i.e., shortened).

Furthermore, a circuit is disposed on the opposite side across a memory cell array storing data. While a column corresponding to an address is selected and accessed, the circuit precharges the bit lines corresponding to all the other columns. With such a structure, a charge of the precharge level can be constantly maintained in the bit lines. Thus, upon completing the activation of the word line corresponding to the input address, the sense operation for the bit line can be immediately performed. Thus, the access time can be significantly shortened.

Furthermore, at the standby state, a charge of the precharge level can be maintained in all the bit lines. As a result, at the first access after the memory cell array gets out of the standby state, upon completing the activation of a word line corresponding to an input address, the sense operation for the bit line can be immediately performed. Thus, the access time can be significantly shortened.

Furthermore, a charge of the precharge level is supplied to virtual ground lines other than the virtual ground line to be accessed, and the charge of the precharge level is not supplied to the virtual ground line to be accessed. Thus., the access time can be significantly shortened.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:

a memory cell array for storing data, the memory cell array including a plurality of columns of memory cells; and a plurality of bit lines connected to the memory cell array for reading out the data, the semiconductor memory device further comprising:

a first precharge operation control circuit for performing a precharge operation with respect to all of the plurality of bit lines immediately after power is turned on; and a second precharge operation control circuit for performing a precharge operation with respect to bit lines corresponding to all columns except a column corresponding to an input address, while the column corresponding to the input address is selected among the plurality of columns and the selected column is accessed, the second precharge operation control circuit also performs a precharge operation with respect to all the plurality of bit lines when the memory cell array is at a standby state.

2. A semiconductor memory device according to claim 1, wherein the second precharge operation control circuit comprises:

a selector for selecting bit lines corresponding to all the other columns while the columns corresponding to the input address are selected and accessed; and a precharge circuit for precharging all the selected bit lines corresponding to all the other columns.

3. A semiconductor memory device according to claim 1, wherein the second precharge operation control circuit comprises:

a selector for selecting all columns based on a signal indicating a standby state when the memory cell array is in the standby state; and a precharge circuit for precharging all bit lines corresponding to all the selected columns.

4. A semiconductor memory device according to claim 1, wherein the second precharge operation control circuit supplies a charge of a precharge level to virtual ground lines other than a virtual ground line to be accessed corresponding to the input address.

5. A semiconductor memory device according to claim 4, wherein the second precharge operation control circuit comprises a virtual ground line selecting circuit for supplying a charge of a precharge level to virtual ground lines other than the virtual ground line to be accessed of the memory cell array and stopping supplying a charge of a precharge level to the virtual ground line to be accessed.

6. A semiconductor memory device according to claim 1 comprising:

a precharge address signal generator for sequentially generating precharge address signals in response to a clock signal immediately after power is turned on;

a selector for sequentially generating precharge column address signals for selecting the column by decoding the precharge address signals; and a precharge circuit for precharging the plurality of bit lines based on the precharge column address signals.

7. A semiconductor memory device according to claim 6 comprising:

an oscillator for outputting oscillating signals immediately after power is turned on; and a divider for dividing the oscillating signals to generate the clock signal to supply to the precharge address signal generator.

* * * * *